(12) United States Patent
Inoue et al.

(10) Patent No.: US 6,214,695 B1
(45) Date of Patent: Apr. 10, 2001

(54) METHOD OF MANUFACTURING SEMICONDUCTOR DEVICE

(75) Inventors: Yasuo Inoue; Yasuyoshi Itoh; Katsuyuki Horita, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/291,043

(22) Filed: Apr. 14, 1999

(30) Foreign Application Priority Data

Nov. 25, 1998 (JP) .................................................. 10-333997

(51) Int. Cl.⁷ .................................................... H01L 21/76
(52) U.S. Cl. ................................................................ 438/424
(58) Field of Search ............................................... 438/424

(56) References Cited

U.S. PATENT DOCUMENTS

| | | |
|---|---|---|
| 5,006,482 | 4/1991 | Kerbaugh et al. . |
| 5,362,669 | 11/1994 | Boyd et al. . |
| 5,459,096 | 10/1995 | Venkatesan et al. . |
| 6,048,771 * | 4/2000 | Lin et al. . |
| 6,048,775 * | 4/2000 | Yao et al. . |
| 6,071,792 * | 6/2000 | Kim et al. . |

* cited by examiner

*Primary Examiner*—John F. Niebling
*Assistant Examiner*—Josetta Jones
(74) *Attorney, Agent, or Firm*—Oblon, Spivak, McClelland, Maier & Neustadt, P.C.

(57) ABSTRACT

An object is to obtain a method of manufacturing semiconductor devices having trench isolation structure which accomplishes simplification of manufacturing process without deterioration of polishing uniformity. After a silicon oxide film (5) is deposited an HDP-CVD method, a polysilicon film (6) is deposited to such a thickness that the polysilicon film (6) on upper regions of raised areas is removed and the polysilicon film (6) in recessed areas remains in a first CMP process and that the polysilicon film (6) serves as a mask in a later etching process. Subsequently, the first CMP process is performed and the etching process to the silicon oxide film (5) is performed by using the polysilicon film (6) after the first CMP process as a mask to remove the silicon oxide film (5) in the upper regions of the raised areas, and a second CMP process is further performed to planarize the semiconductor substrate (1).

11 Claims, 10 Drawing Sheets

METHOD OF MANUFACTURING SEMICONDUCTOR DEVICE

BACKGROUND OF THE INVENTION

1. Field of the Invention

The present invention relates to a method of manufacturing semiconductor devices having trench-type device isolation structure.

2. Description of the Background Art

In manufacturing semiconductor integrated circuits, device isolation regions must be formed to prevent electric interference among devices during operation so that the individual devices can be controlled perfectly independently. Methods for forming the device isolation regions include the well-known trench isolation method, for which many improvements have been proposed. This trench isolation method is generally used for a wide variety of LSIs.

In the trench isolation method, a trench (groove) formed on a substrate is filled with insulator to electrically isolate adjacent devices, such as MOS transistors. Since this method can maintain required electric isolating capability even with miniaturized devices, it is considered to be an indispensable device isolation method for further miniaturization of semiconductor integrated circuits.

FIGS. 15 to 21 are sectional views showing a conventional method of forming trench isolation. As shown in FIG. 15, a stacked mask layer 2 made of silicon oxide film and silicon nitride film is deposited by a CVD method all over a single-crystal semiconductor substrate 1 (which may be simply referred to as a "substrate" hereinafter).

Subsequently, as shown in FIG. 16, a resist mask 3 is formed with openings for formation of trenches in given areas. Next, as shown in FIG. 17, an etching is applied by using the resist mask 3 as a mask to form a plurality of trenches 4, and then the resist mask 3 is removed as shown in FIG. 18.

Next, as shown in FIG. 19, a silicon oxide film 5 is deposited in the trenches 4 and on the stacked mask layer 2 by using an HDP-CVD (High Density Plasma-Chemical Vapor Deposition) method.

Next, as shown in FIG. 20, the entire surface is polished by using a chemical mechanical polishing (CMP) method to remove the silicon oxide film 5 on the stacked mask layer 2 and part of the surface of the silicon oxide film 5 in the trenches 4 for planarization.

Then, as shown in FIG. 21, the silicon nitride film part of the stacked mask layer 2 is removed by etching using thermal phosphoric acid and the silicon oxide film part of the stacked mask layer 2 is removed by wet etching using HF, and a trench isolation structure with the silicon oxide film 5 buried in the trenches 4 is thus completed.

Subsequently, desired semiconductor devices are formed on the semiconductor substrate 1 in the plurality of device formation areas AS which are trench-isolated by the silicon oxide film 5 buried in the trenches 4 to fabricate semiconductor integrated circuit devices.

During formation of the trenches 4, it is not essential to etch the stacked mask layer 2 and the semiconductor substrate 1 by using the resist mask 3. In a widely used method, the stacked mask layer 2 is patterned by using the resist mask 3 and then the patterned stacked mask layer 2 is used as a mask for etching the semiconductor substrate 1. Although not shown in the diagrams, an inner-wall oxide film may be formed inside the trenches (grooves) formed in the substrate.

The conventional trench isolation method shown in FIGS. 15 to 21 merely applies a chemical mechanical polishing after deposition of the silicon oxide film 5, however, and it is difficult to accomplish the polishing by using a CMP method so that the silicon oxide film 5 (see FIG. 22) is completely removed in raised areas such as the relatively large flat area A1 with the silicon oxide film 5 in the trenches 4 remaining unremoved.

That is to say, while applying the CMP in such a manner that the silicon oxide film 5 in the trenches 4 certainly remains tends to allow the silicon oxide film 5 to remain as a residue 5a after polishing as shown in FIG. 23, applying the CMP so as to certainly prevent the residue 5a after polishing tends to cause over-polishing to the trenches 4 and intervals between the trenches 4 as shown in FIG. 24, which may result in polished injuries 5b.

As described above, the conventional trench isolation method shown in FIGS. 15 to 21 has the problem that it is difficult to uniformly polish the entire substrate surface.

Accordingly, an improvement of the trench isolation method has been accomplished as shown in FIGS. 25 to 27. FIG. 25 shows the structure obtained through the process steps shown in FIGS. 15 to 19 in the conventional trench isolation method.

Prior to polishing the structure shown in FIG. 25 by CMP, a pre-etching is performed to selectively remove the flat area A1 of the silicon oxide film 5 as shown in FIG. 26.

Then the structure shown in FIG. 26 is polished by the CMP method to obtain a highly accurate trench isolation structure without residual 5a after polishing nor polished injuries 5b, as shown in FIG. 27.

However, the improved method shown in FIGS. 25 to 27 additionally requires a process of photolithography during pre-etching to improve the uniformity of CMP. This requires an increased number of process steps due to the additional mask for pre-etching, leading to an increase in the manufacturing cost.

SUMMARY OF THE INVENTION

According to a first aspect of the present invention, a method of manufacturing a semiconductor device having a trench isolation structure comprises the steps of: (a) forming an auxiliary layer on a semiconductor substrate; (b) forming a plurality of trenches in upper part of the semiconductor substrate including the auxiliary layer; (c) forming an insulating film all over the surface to obtain a recessed area in which the insulating film is buried in the plurality of trenches and a raised area in which the insulating film projects on the auxiliary layer where the plurality of trenches are absent; (d) forming a polishing assistant film on the recessed area and the raised area of the insulating film; (e) performing a first chemical mechanical polishing process to the polishing assistant film under such a polishing condition that the polishing assistant film on upper region of the raised area is removed and the polishing assistant film on the recessed area remains; (f) selectively removing unmasked part of the insulating film completely by an etching process using the polishing assistant film remaining after the step (e) as a mask; (g) performing a second chemical mechanical polishing process to the polishing assistant film and the insulating film under the polishing assistant film by using the auxiliary layer as a stopper layer to remove the polishing assistant film and the insulating film under the polishing assistant film; and (h) removing the auxiliary layer.

Preferably, according to a second aspect of the present invention, in the method of manufacturing a semiconductor device, the selectivity between polishing rates of the polishing assistant film and the insulating film in the second chemical mechanical polishing process is set approximately equal.

According to a third aspect of the present invention, a method of manufacturing a semiconductor device having a trench isolation structure comprises the steps of: (a) forming an auxiliary layer on a semiconductor substrate; (b) forming a plurality of trenches in upper part of the semiconductor substrate including the auxiliary layer; (c) forming an insulating film all over the surface to provide a recessed area in which the insulating film is buried in the plurality of trenches and a raised area in which the insulating film projects on the auxiliary layer where the plurality of trenches are absent; (d) forming a polishing assistant film on the recessed area and the raised area of the insulating film; and (e) performing a chemical mechanical polishing process to the polishing assistant film and the insulating film by using the auxiliary layer as a stopper layer to completely remove the polishing assistant film and the insulating film.

Preferably, according to a fourth aspect of the present invention, the method of manufacturing a semiconductor device further comprises the step (f) of, after the step (c) and before the step (d), removing part of the raised area which is predetermined to be difficult to planarize by the chemical mechanical polishing process performed in the step (e).

As described above, the method of manufacturing a semiconductor device of the first aspect of the present invention comprises the steps of (d) forming a polishing assistant film on a recessed area and a raised area of the insulating film, (e) performing a first chemical mechanical polishing process to the polishing assistant film under such a polishing condition that the polishing assistant film formed on the upper region of the raised area is removed and the polishing assistant film on the recessed area remains, and (f) applying an etching process by using the polishing assistant film left after the step (e) as a mask to selectively remove the unmasked insulating film completely.

The polishing assistant film is thus removed in step (e) and the insulating film whose surface is exposed in the upper region of the raised area is certainly removed in step (f). That is to say, the insulating film in the upper region of the raised area which will be difficult to remove in the second chemical mechanical polishing process is certainly removed in step (f). Since the auxiliary layer serving as a stopper film in the second chemical mechanical polishing process is formed under the raised area, removing the insulating film in the upper region in the raised area before the second chemical mechanical polishing process raises no problem.

As a result, a trench-isolated structure can be obtained through steps (g) and (h) without deteriorating the polishing uniformity.

To obtain the above effect, the thickness of the polishing assistant film formed in step (d) is set so that the above-mentioned polishing condition is satisfied and so that the polishing assistant film can function as a mask in the etching process, on the basis of the selectivity between the insulating film and the polishing assistant film in the etching process, the thickness of the insulating film formed in step (c), and the shape of the recessed area and the raised area.

Further, since the polishing assistant film is patterned in a self-aligned manner during the first chemical mechanical polishing process (since it is removed only on the upper region of the raised area), a photolithography process for patterning the polishing assistant film is not required. Accordingly, the manufacturing process can be simplified as compared with the conventional improved method in which a pre-etching is performed by using a photolithography process.

According to the method of manufacturing a semiconductor device of the second aspect, setting the selectivity between the polishing rates of the polishing assistant film and the insulating film in the second chemical mechanical polishing approximately equal further enhances the polishing accuracy in the second chemical mechanical polishing process.

According to the method of manufacturing a semiconductor device of the third aspect, a chemical mechanical polishing process is performed in step (e) to the polishing assistant film and the insulating film by using the auxiliary layer as a stopper layer to completely remove the polishing assistant film and the insulating film.

Accordingly, when the thickness of the polishing assistant film formed in step (d) is set so that the polishing assistant film on the recessed area and the insulating film on the raised area are almost simultaneously removed in the chemical mechanical polishing process in step (e) on the basis of the selectivity between the insulating film and the polishing assistant film in the chemical mechanical polishing process, then a trench isolation structure can be obtained without deteriorating the polishing uniformity merely by performing steps (d) and (e) after step (c).

Further, no photolithography process for patterning the polishing assistant film is required, since it is simply formed all over the surface. Hence, when steps (c) and (d) are successively performed, the manufacturing process can be simplified as compared with the conventional improved method in which a pre-etching is performed by using a photolithography process.

According to the method of manufacturing a semiconductor device of the fourth aspect, the step performed after step (c) and before step (d) to remove part of the raised area which is predetermined to be difficult to planarize by the chemical mechanical polishing process in step (e) further improves the polishing uniformity.

The present invention has been made to solve the above-described problem, and an object of the present invention is to provide a method of manufacturing semiconductor devices with trench isolation structure which accomplishes simplification of the manufacture process without deterioration of polishing uniformity, or which accomplishes further improvement of the polishing uniformity.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

FIGS. 1 to 6 are sectional views showing a method of manufacturing semiconductor devices with trench isolation structure according to a first preferred embodiment of the present invention. The manufacturing method of the first preferred embodiment will now be described referring to these drawings.

Figure 1:
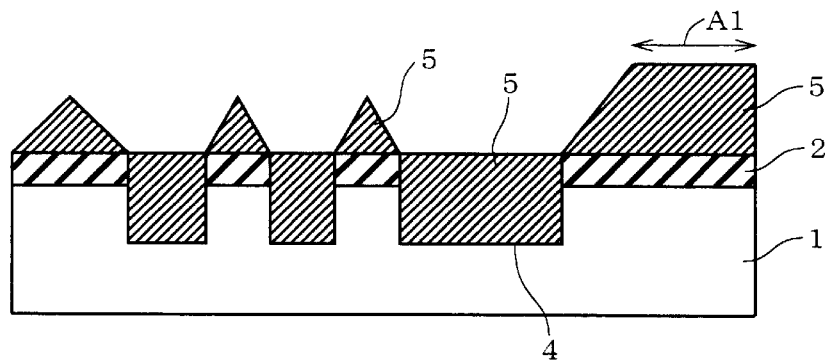
FIGS. 1 to 6 are sectional views showing a method of manufacturing semiconductor devices with trench isolation structure according to a first preferred embodiment of the present invention.

First, as shown in FIG. 1, a silicon oxide film 5 is buried in a plurality of trenches 4 for device isolation by an HDP-CVD method, thus providing irregular structure of the silicon oxide film 5 having recessed areas in which the silicon oxide film 5 is buried in the plurality of trenches 4 and raised areas in which the insulating film projects on the stacked mask layer 2 with no trenches 4. The structure shown in FIG. 1 can be obtained through the conventional process steps shown in FIGS. 15 to 19.

Figure 2:
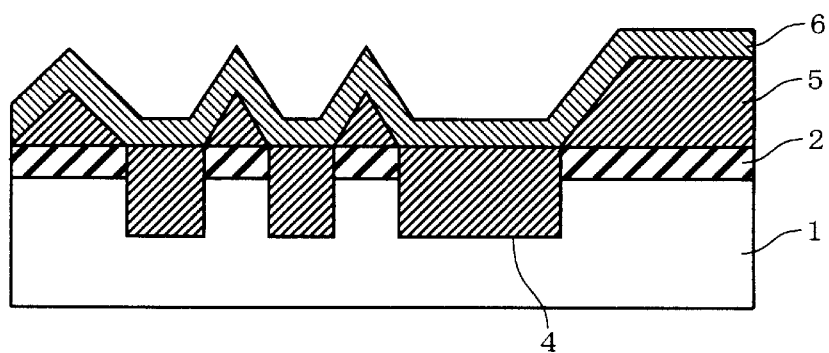

Next, as shown in FIG. 2, a polysilicon film 6 is deposited by a CVD method on the entire substrate surface of the structure shown in FIG. 1.

At this time, the film thickness of the polysilicon film 6 must satisfy the polishing conditions that the polysilicon film 6 formed on the upper regions of the raised areas, such as the flat area A1 formed at the highest level above the surface of the semiconductor substrate 1, is certainly removed by a first CMP process and that the polysilicon film 6 on the silicon oxide film 5 in the trenches 4 certainly remains. The flat area A1 is formed due to a large device isolation interval for formation of a large semiconductor device formation area.

Also, the film thickness of the polysilicon film 6 must satisfy the etching condition for keeping the polysilicon film 6 thick enough to serve as a mask for etching in an oxide film etching process after the first CMP process.

That is to say, the film thickness of the polysilicon film 6 must satisfy both of the polishing condition for the first CMP process and the etching condition for the oxide film etching process.

Figure 7:
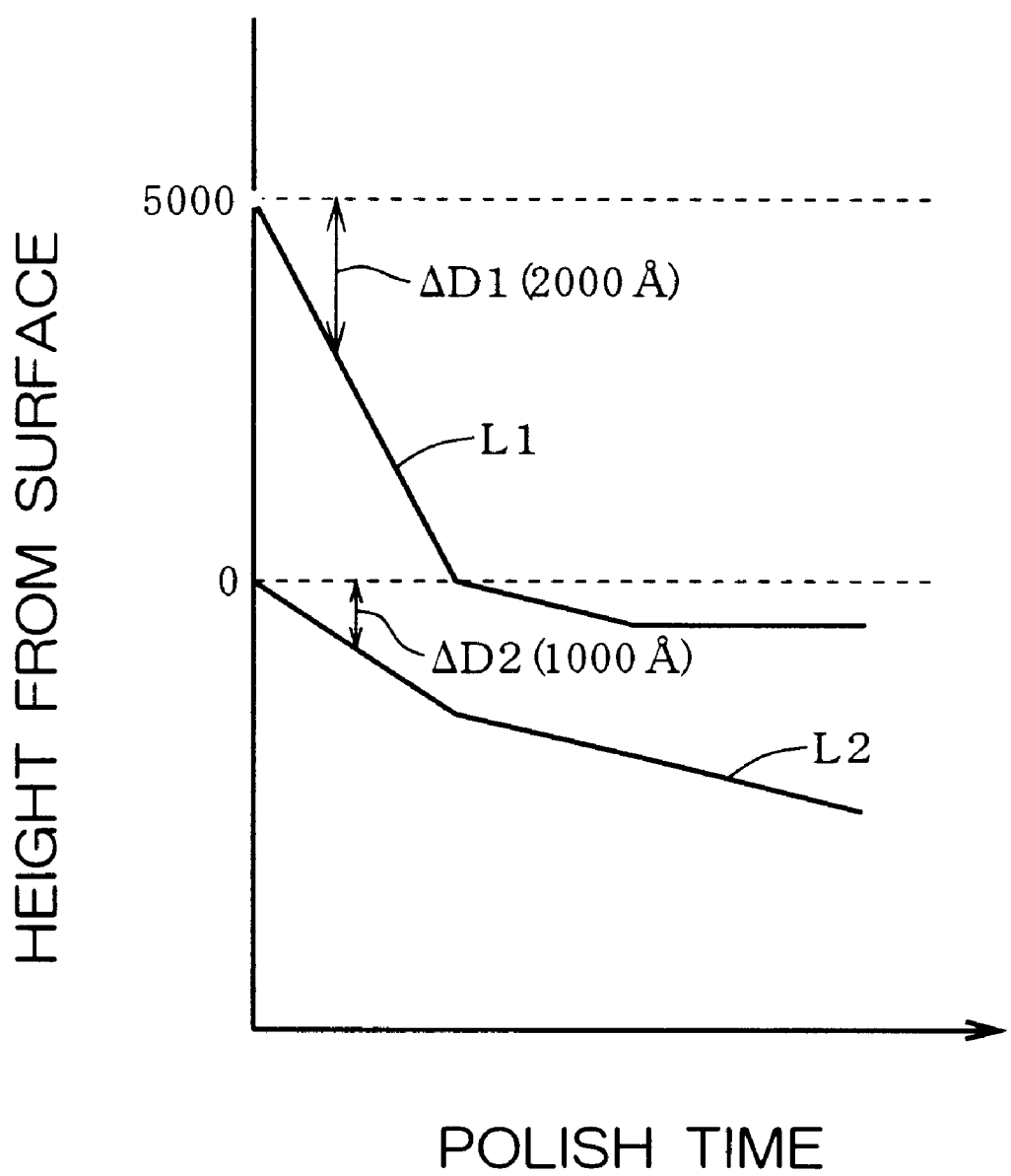
FIG. 7 is a graph showing experimental results in the first preferred embodiment.

FIG. 7 shows experimental results obtained by applying a CMP to a silicon oxide film 5 having a structure with raised and recessed areas as shown in FIG. 1, where the highest raised area having the flat area A1 is 5000 Å high and a 100-$\mu$m-wide trench 4 forms the broadest recessed area. The diagram shows the height variation L1 of the silicon oxide film 5 in the raised area and the depth variation L2 of the silicon oxide film 5 in the largest recessed area.

As shown in FIG. 7, while the silicon oxide film 5 in the highest raised area is polished away by $\Delta D1$ (2000 Å) through CMP processing, the silicon oxide film 5 in the largest recessed area is polished away by about half of it, or by $\Delta D2$ (1000 Å). That is to say, in the polishing to the same silicon oxide film, the polishing rates are in the ratio of 2:1 between the highest raised area and the largest recessed area, which trend lasts until the height of the highest raised area becomes zero. From the fact that the polishing rates to silicon oxide film and polysilicon are about the same, the following estimation holds.

While the polysilicon film 6 deposited on the upper region of the raised area, such as the flat area A1, is all polished away by the later first CMP process, the polysilicon film 6 deposited on the largest recessed area is polished by about half of the thickness, and the polysilicon film 6 deposited on other recessed areas is polished away by less than half.

The estimation above shows that the film thickness of the polysilicon film 6 in the process step shown in FIG. 2 must be set not less than twice a value obtained by dividing the film thickness of the silicon oxide film 5 by the etch rate selectivity of the oxide film to polysilicon.

Specifically, when a silicon oxide film 5 having a thickness of 500 nm is deposited and the etch rate selectivity of the oxide film to polysilicon is 10 in the oxide film etching (the oxide film is etched at a rate ten times that of polysilicon), then the polysilicon film 6 having a film thickness of 100 nm or larger must be deposited.

In this case, when the polysilicon film 6 deposited on the upper region 1 in the raised area has been all polished away in the first CMP processing, the polysilicon film 6 deposited on the largest recessed area can remain with a thickness of 50 nm or more, and then it sufficiently functions as a mask for etching to the 500-nm-thick silicon oxide film 5 with the selectivity of 10.

Figure 3:
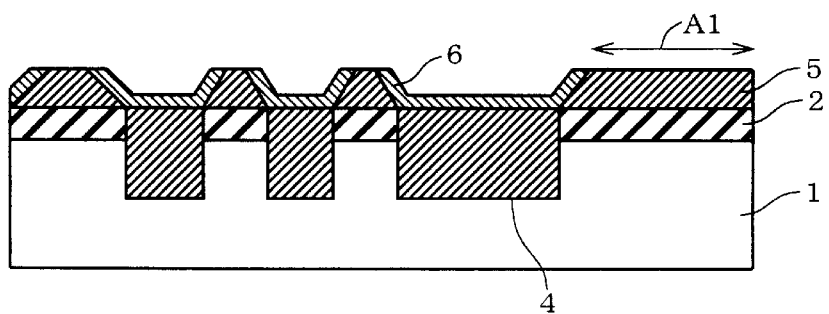
Figure 4:
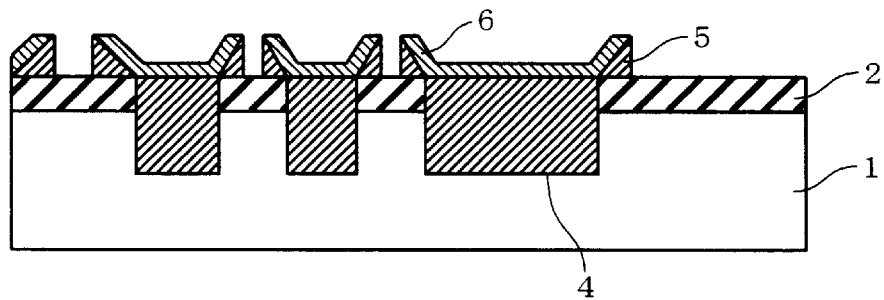

After the polysilicon is deposited, as shown in FIG. 3, the first CMP process is applied until the polysilicon film 6 deposited on the upper regions of the raised areas, like the flat area A1, is all removed and the surface of the silicon oxide film 5 in the upper regions of the raised areas is exposed. At this time, as has been described above, the polysilicon film 6 deposited on the recessed areas remains with a thickness enough to serve as a mask in the successively performed oxide film etching Next, as shown in FIG. 4, an anisotropic etching (oxide film etching) is applied to the silicon oxide film 5 by using the remaining polysilicon film 6 as a mask to entirely remove the unmasked silicon oxide film 5 to expose the surface of the stacked mask layer 2 (the upper silicon nitride film not shown) beneath the silicon oxide film 5. At this time, the silicon oxide film 5 in the upper regions of the raised areas, such as the flat area A1, which is apt to remain as a residue, is certainly all removed. Removing the silicon oxide film 5 in the upper regions of the raised areas before a second CMP process raises no problem since the stacked mask layer 2 serving as a stopper film in the second CMP process is formed under the raised areas.

Figure 5:
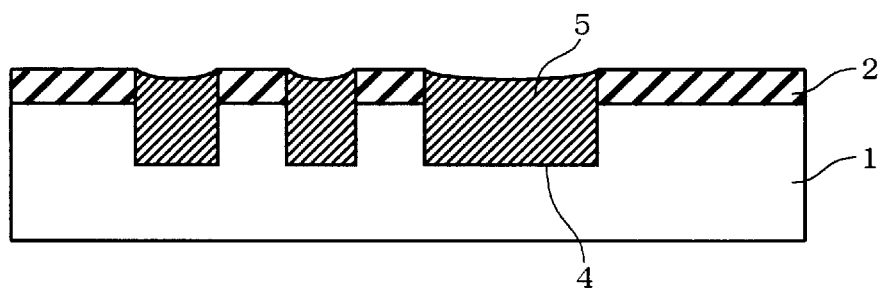
Figure 6:
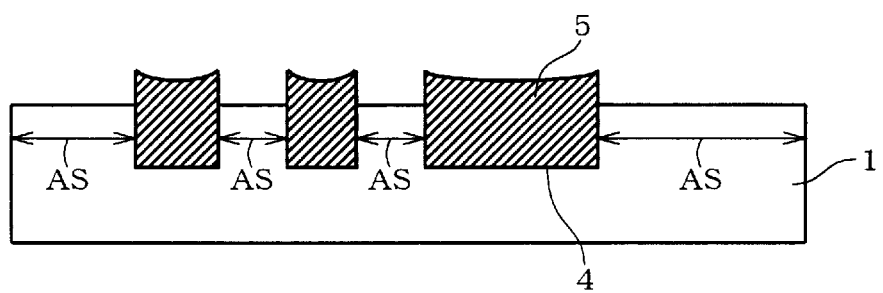

Subsequently, as shown in FIG. 5, the second CMP process is performed to polish the entire surface by using the stacked mask layer 2 as a stopper, and then as shown in FIG. 6, the silicon nitride film part of the stacked mask layer 2 is removed by an etching using hot phosphoric acid and the silicon oxide film part of the stacked mask layer 2 is removed by a wet etching using HF, and the trench isolation structure with the silicon oxide film 5 buried in the trenches 4 is thus completed.

At this time, if the polishing selectivity between the polysilicon film 6 and the silicon oxide film 5 in the second CMP process is set approximately even, the polishing accuracy is further enhanced in the second CMP processing.

Then, not to mention semiconductor integrated circuits with MOS transistors, various kinds of semiconductor integrated circuits in the entire fields of LSIs can be fabricated by forming desired semiconductor devices in the plurality of device formation areas AS on the semiconductor substrate 1 which are trench-isolated by the silicon oxide film 5 buried in the trenches 4.

As described above, the method of manufacturing a semiconductor device of the first preferred embodiment can manufacture trench-isolated semiconductor devices without deterioration of polishing uniformity by depositing the silicon oxide film 5, depositing the polysilicon film 6 with a thickness satisfying the above-mentioned polishing condition and etching condition, applying the first CMP process, etching the silicon oxide film 5 by using the polysilicon film 6 after the first CMP process as a mask to remove the silicon oxide film 5 in the upper regions in the raised areas, and then applying the second CMP process to planarize the semiconductor substrate 1.

Further, the polysilicon film 6 is patterned in a self-aligned manner in the first CMP process (it is removed only in the upper regions of the raised areas), and the process therefore requires no photolithography process for patterning the polysilicon film 6. Hence, the manufacture process can be simplified as compared with the conventional improved method in which a pre-etching is performed by using a photolithography process.

Second Preferred Embodiment

Figure 8:
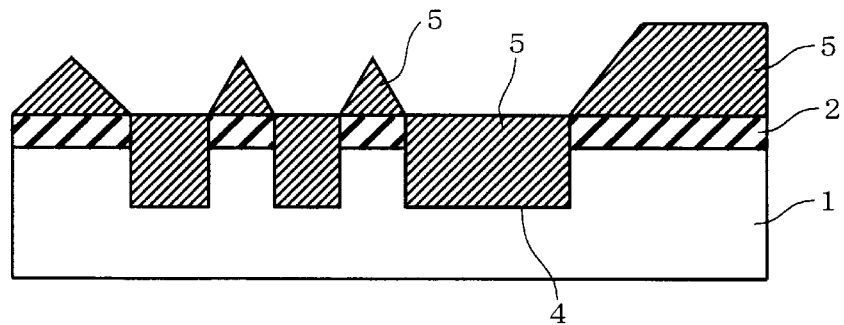
FIGS. 8 to 10 are sectional views showing a method of manufacturing semiconductor devices with trench isolation structure according to a second preferred embodiment of the present invention.
Figure 9:
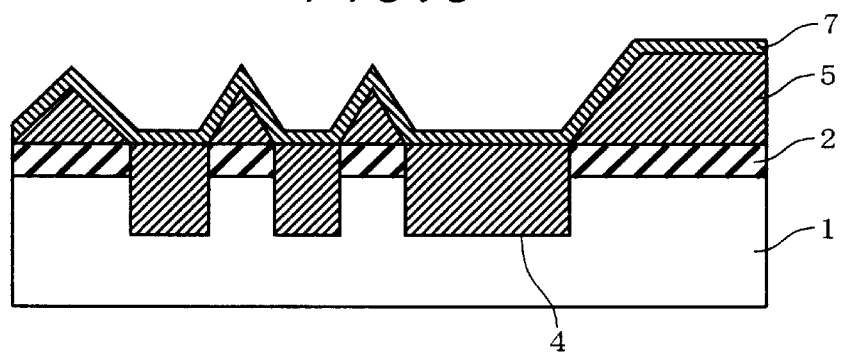
Figure 10:
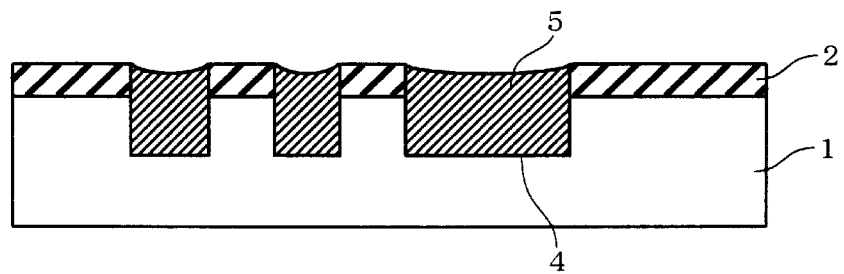

Next, FIGS. 8 to 10 are sectional views showing a method of manufacturing semiconductor devices with trench isolation structure according to a second preferred embodiment of the present invention. The manufacturing method of the second preferred embodiment will now be described referring to these drawings.

First, as shown in FIG. 8, the structure in which the silicon oxide film 5 is buried in a plurality of device isolating trenches 4 by an HDP-CVD method is obtained similarly to the first preferred embodiment. The structure shown in FIG. 8 can be obtained through the conventional process steps shown in FIGS. 15 to 19.

Next, as shown in FIG. 9, a silicon nitride film 7 is deposited by a CVD method all over the substrate surface of the structure shown in FIG. 8.

Subsequently, as shown in FIG. 10, the entire surface is polished by a CMP processing by using the stacked mask layer 2 as a stopper. Then, similarly to the first preferred embodiment, the stacked mask layer 2 is removed to form the trench isolation structure with the silicon oxide film 5 buried in the trenches 4.

In this way, in the method of manufacturing a semiconductor device of the second preferred embodiment, a silicon nitride film is deposited all over the surface so that the polishing to the raised areas in which the silicon oxide film 5 is formed on the stacked mask layer 2 progresses faster in the earlier stage of the CMP processing. Then the silicon nitride film 7 in the raised areas is removed earlier than the silicon nitride film 7 in the recessed areas, and therefore the surface of the silicon oxide film 5 in the raised areas is exposed first.

In the continuance of the CMP process, the thick silicon oxide film deposited in the raised areas is polished faster due to the difference between the polishing rate of the silicon nitride film and that of the silicon oxide film, and the silicon oxide film 5 in the raised areas and the silicon nitride film 7 in the recessed areas are completely removed almost at the same time. Consequently, the entire substrate surface can be polished uniformly with respect to the substrate surface in a self-aligned manner, in spite of the silicon oxide film 5 irregularly formed on the substrate surface.

Further, the manufacturing method of the second preferred embodiment does not require patterning to the silicon nitride film 7 at all, and it of course requires no photolithography process for patterning the silicon nitride film 7, which enables simplification of the manufacturing process as compared with the conventional improved method in which a pre-etching is performed by using a photolithography process.

The film thickness of the silicon nitride film 7 deposited in the process step shown in FIG. 9 must be set equal to or smaller than a value obtained by dividing the thickness of the silicon oxide 5 by the ratio between the polishing rate of the silicon oxide film and that of the silicon nitride film so that the silicon oxide film 5 in the raised areas and the silicon nitride film 7 in the recessed areas can be removed almost simultaneously. Specifically, when a 500-nm-thick silicon oxide film 5 is deposited and the polishing rate ratio of the oxide film to the silicon nitride film is 5, then the thickness of the silicon nitride film 7 should be set to 100 nm or smaller.

In practice, it depends on the shape of the irregularities on the surface of the semiconductor substrate 1 after the formation of the silicon oxide film 5. Further, since the thickness of the silicon nitride film 7 in the raised areas is reduced earlier in the initial stage of the CMP process, it must be set by considering this reduction in thickness. Accordingly, it is set in the range of about 10 to 100 nm. For this value, needless to say, the thickness of the silicon nitride film 7 must be set larger as the thickness of the silicon oxide film 5 becomes larger.

Further, the surface of the silicon oxide film 5 in the trenches 4 in the recessed areas may be somewhat removed in the CMP processing because the silicon oxide film 5 in the raised areas and the silicon nitride film 7 in the recessed areas are removed almost simultaneously. However, it is possible to certainly avoid adverse effects on the finally obtained trench isolation structure by forming the silicon oxide film 5 in the trenches 4 thicker by the amount of the surface removal (by adjusting the thickness of the stacked mask layer 2, for example) by considering the surface removal of the silicon oxide film 5 in the trenches 4 in the CMP process.

For the chemical mechanical polishing rates of the oxide film and silicon nitride film, it is preferable to set the polishing rate of the silicon nitride film to a value of not more than one-third of the polishing rate of the silicon oxide film to prevent deterioration of the polishing uniformity.

If the ratio between the polishing rates of the silicon nitride film and the silicon oxide film is too small (if the polishing rate of the silicon nitride film is over one-third of the polishing rate of the silicon oxide film and approaches one), then the removal of the silicon nitride film 7 in the recessed areas cannot be suppressed in the earlier stage of the CMP process, which may cause polished injuries.

Further, when the polishing rate of the silicon nitride film is over one-third of the polishing rate of the silicon oxide film, the silicon nitride film 7 must be formed relatively thick to prevent the polished injuries. Specifically, when a 500-nm-thick silicon oxide film 5 is deposited and the ratio of the polishing rate of the oxide film to that of the silicon nitride film is two, the thickness of the silicon nitride film 7 must be set to about 160 to 250 nm.

Then the thickness of the silicon nitride film 7 cannot be small enough to sufficiently reflect the irregular structure of the semiconductor substrate 1 of FIG. 8, and the irregular structure of the silicon oxide film 5 on the semiconductor substrate 1 is smoothed by the formation of the silicon nitride film 7. Then the silicon nitride film in the raised areas cannot be removed earlier in the later CMP process, adversely affecting the uniformity of polishing.

To avoid the adverse effect on the polishing uniformity, the polishing rate of the silicon nitride film is preferably set to one-third of the polishing rate of the silicon oxide film or smaller.

For the chemical mechanical polishing rates to the oxide film and the silicon nitride film, it is preferable to set the polishing rate of the silicon nitride film to one-tenth of the polishing rate of the silicon oxide film or larger, to improve the polishing uniformity.

If the ratio between the polishing rates is too large (if the polishing rate of the silicon nitride film is under one-tenth of the polishing rate of the silicon oxide film), then the silicon nitride film 7 in the recessed areas may be left unremoved even after the silicon nitride film 7 in the raised areas has been removed in the earlier stage of polishing and the silicon oxide film 5 in the raised areas has also been polished away.

Third Preferred Embodiment

FIGS. 11 to 14 are sectional views showing a method of manufacturing semiconductor devices with trench isolation structure according to a third preferred embodiment of the present invention. The manufacturing method of the third preferred embodiment will now be described referring to these drawings.

Figure 11:
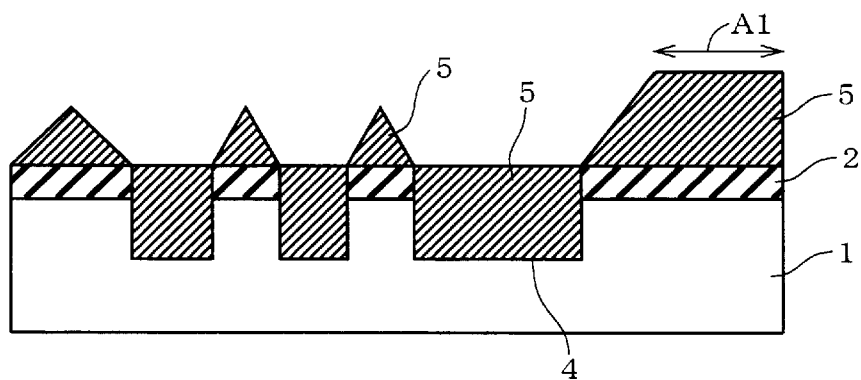
FIGS. 11 to 14 are sectional views showing a method of manufacturing semiconductor devices with trench isolation structure according to a third preferred embodiment of the present invention.

First, as shown in FIG. 11, the structure in which the silicon oxide film 5 is buried in device-isolating trenches 4 by an HDP-CVD method is obtained. The structure shown in FIG. 11 can be obtained through the conventional process steps shown in FIGS. 15 to 19.

Figure 12:
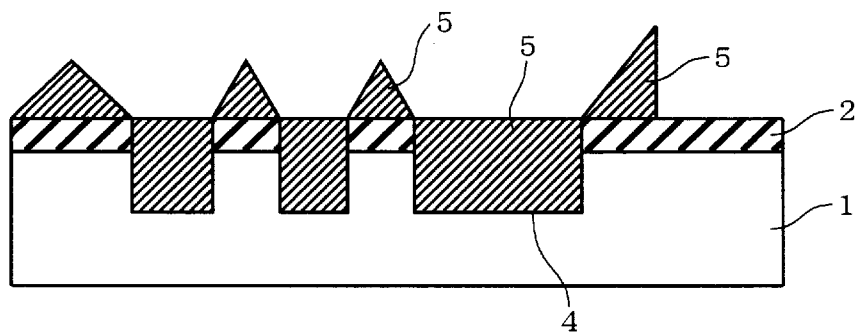

Then, as shown in FIG. 12, a pre-etching is performed to selectively remove the flat area A1 of the silicon oxide film 5.

Figure 13:
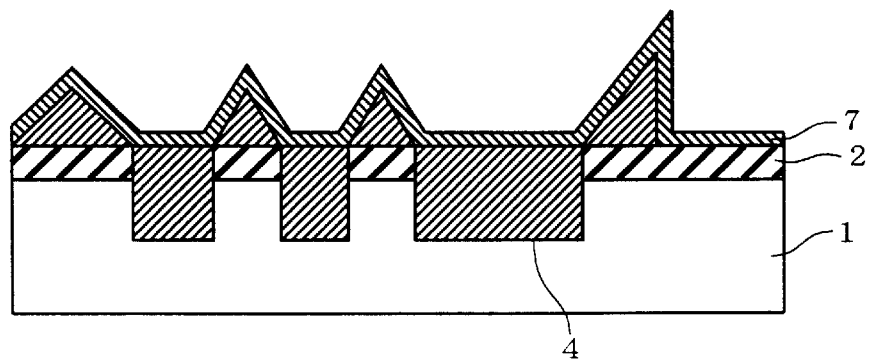

Next, as shown in FIG. 13, a silicon nitride film 7 is deposited by a CVD method all over the substrate surface of the structure shown in FIG. 12.

Figure 14:
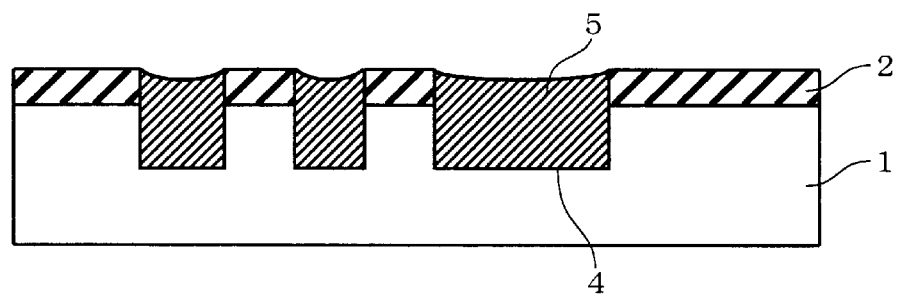
Figure 15:
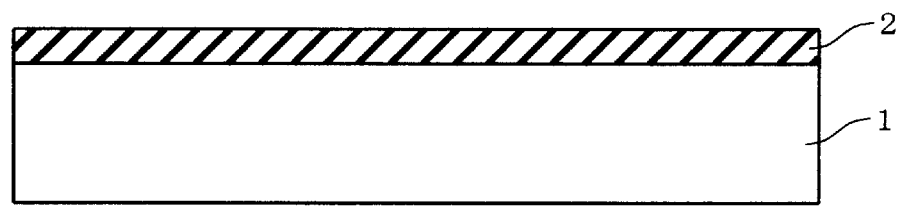
FIGS. 15 to 21 are sectional views showing a conventional method of manufacturing semiconductor devices with trench isolation structure.
Figure 16:
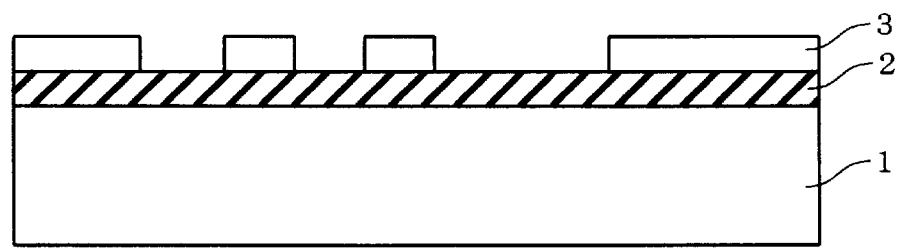
Figure 17:
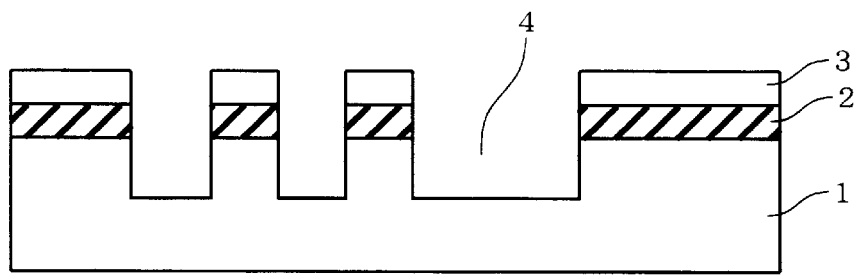
Figure 18:
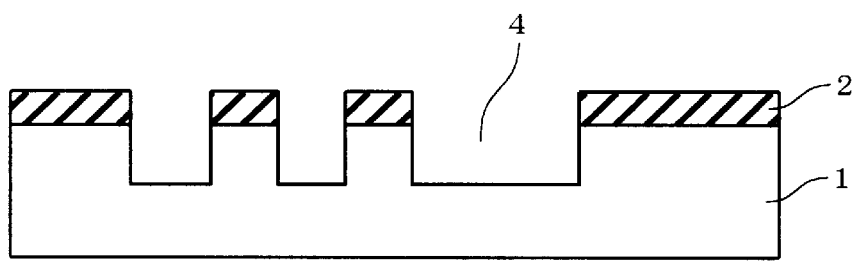
Figure 19:
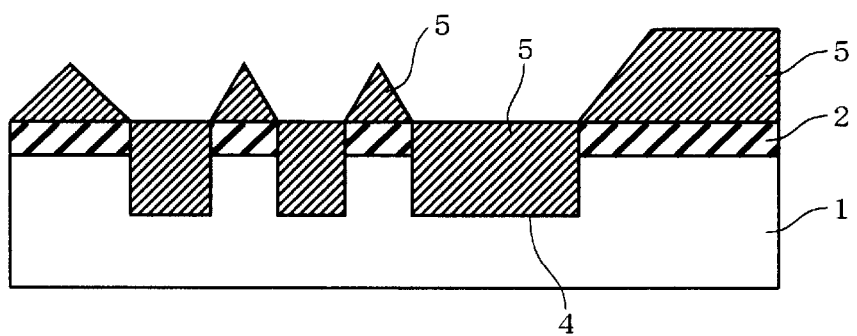
Figure 20:
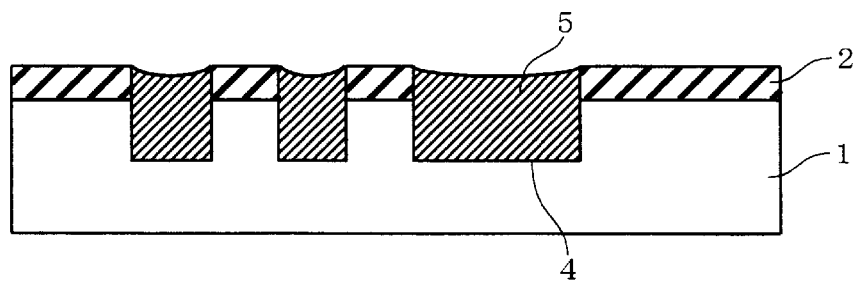
Figure 21:
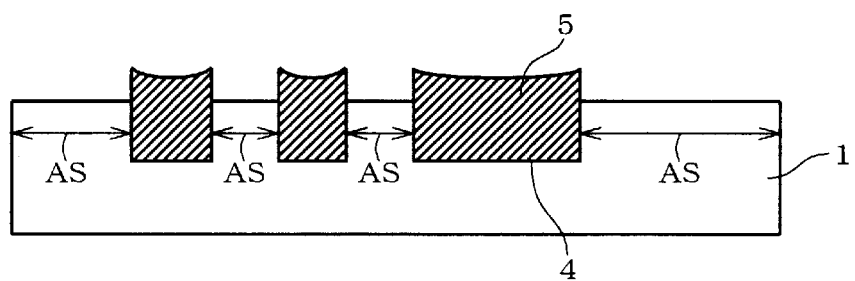
Figure 22:
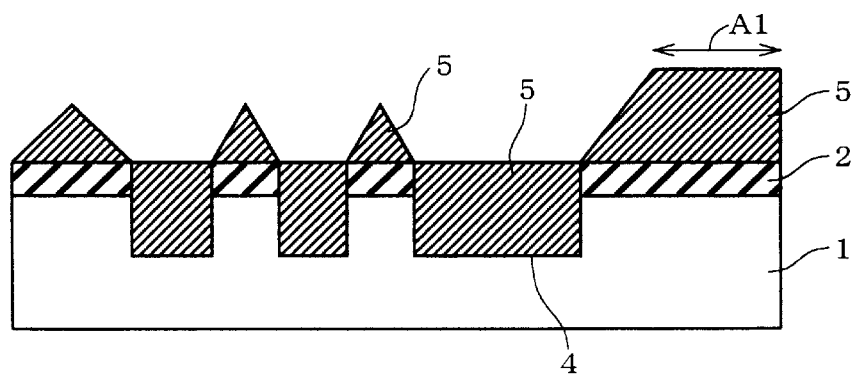
FIGS. 22 to 24 are sectional views used to explain problems of the conventional manufacturing method.
Figure 23:
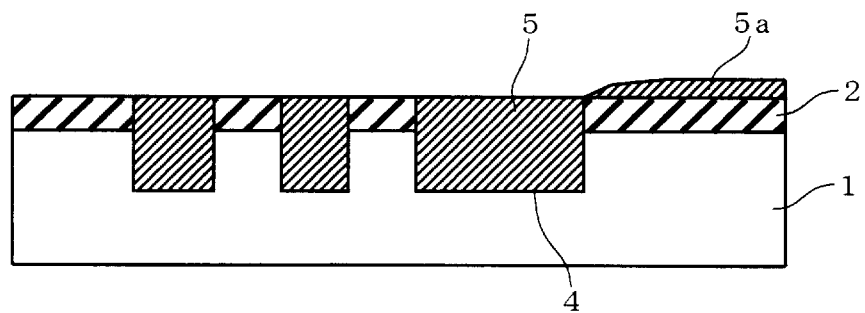
Figure 24:
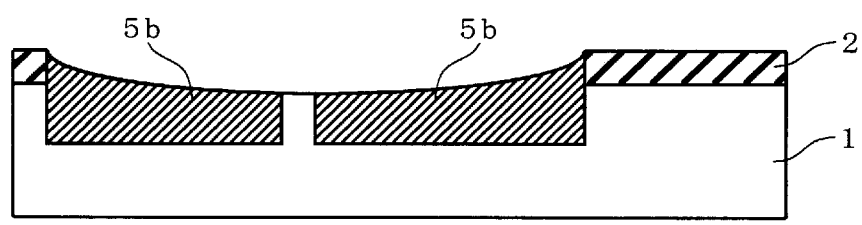
Figure 25:
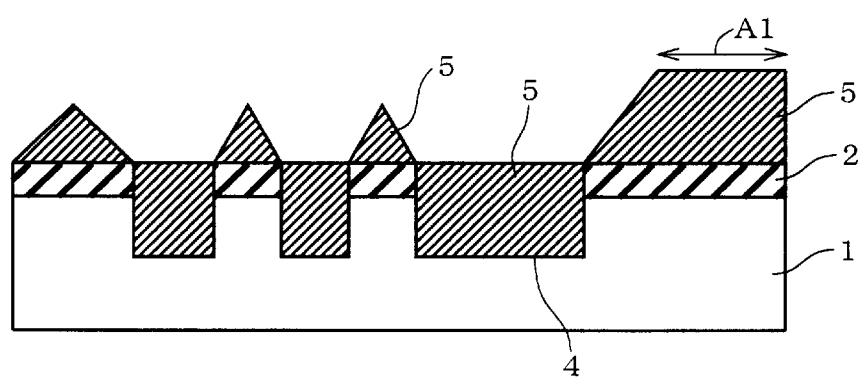
FIGS. 25 to 27 are sectional views showing an improvement in the conventional method of manufacturing a trench-isolated semiconductor device.
Figure 26:
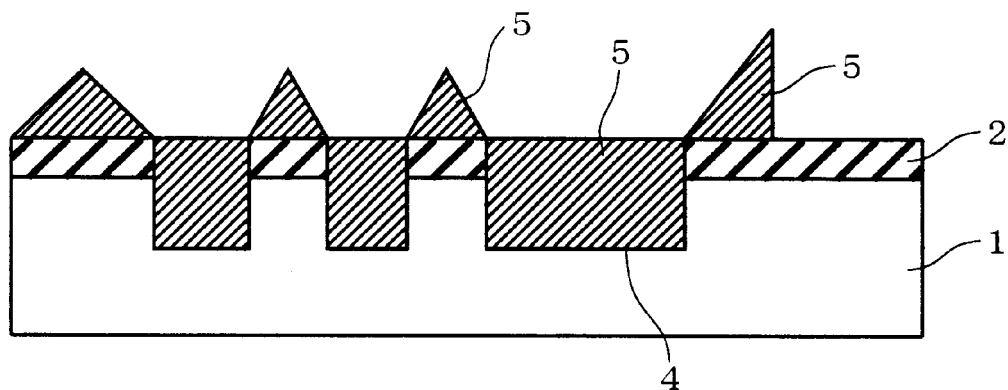
Figure 27:
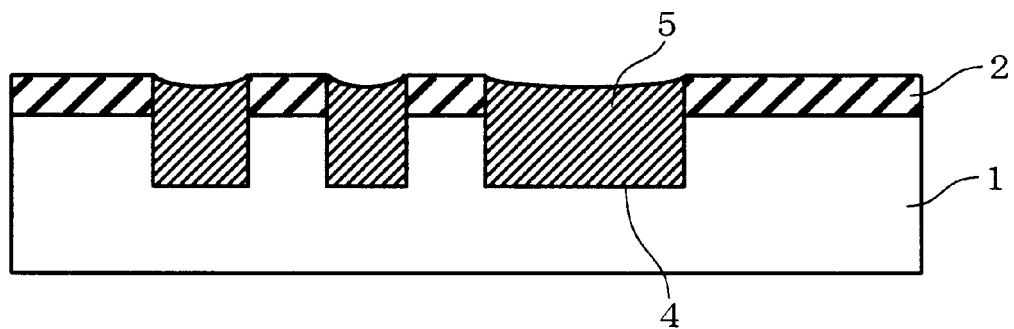

Subsequently, as shown in FIG. 14, the entire surface is polished by a CMP process by using the stacked mask layer 2 as a stopper. Then, similarly to the first preferred embodiment, the stacked mask layer 2 is removed and the trench isolation structure with the silicon oxide film 5 buried in the trenches 4 is thus completed. Conditions for the film thickness of the silicon nitride film 7, the ratio between the polishing rates of the silicon nitride film and the silicon oxide film, etc. are set similarly to those in the second preferred embodiment.

As described above, according to the method of manufacturing a semiconductor device of the third preferred embodiment, a silicon nitride film is deposited all over the surface prior to the CMP process, and then the silicon oxide film deposited thick in the raised areas is polished faster due to the difference between the polishing rate of the silicon nitride film and the polishing rate of the silicon oxide film, which enables uniform polishing with respect to the substrate surface on the entire substrate surface in a self-aligned manner even if the silicon oxide film 5 having varying thickness is formed on the substrate surface.

Further, the flat area A1 which is difficult to certainly uniformly polish even through the deposition of the silicon nitride film 7 can certainly be removed by the pre-etching shown in FIG. 12, which enables more uniform polishing with respect to the substrate surface than that in the second preferred embodiment.

While the invention has been described in detail, the foregoing description is in all aspects illustrative and not restrictive. It is understood that numerous other modifications and variations can be devised without departing from the scope of the invention.

We claim:

1. A method of manufacturing a semiconductor device having a trench isolation structure, comprising the steps of:
   (a) forming an auxiliary layer on a semiconductor substrate;
   (b) forming a plurality of trenches in upper part of said semiconductor substrate including said auxiliary layer;
   (c) forming an insulating film all over the surface to obtain a recessed area in which the insulating film is buried in said plurality of trenches and a raised area in which the insulating film projects on said auxiliary layer where said plurality of trenches are absent;
   (d) forming a polishing assistant film on said recessed area and said raised area of said insulating film;
   (e) performing a first chemical mechanical polishing process to said polishing assistant film under such a polishing condition that said polishing assistant film on upper region of said raised area is removed and said polishing assistant film on said recessed area remains;
   (f) selectively removing unmasked part of said insulating film completely by an etching process using said polishing assistant film remaining after said step (e) as a mask;
   (g) performing a second chemical mechanical polishing process to said polishing assistant film and said insulating film under said polishing assistant film by using said auxiliary layer as a stopper layer to remove said polishing assistant film and said insulating film under said polishing assistant film; and
   (h) removing said auxiliary layer,
wherein selectivity between polishing rates of said polishing assistant film and said insulating film in said second chemical mechanical polishing process is set approximately equal.

2. The method of manufacturing a semiconductor device according to claim 1, wherein, when selectivity of said polishing assistant film to said insulating film in said etching process is 1/N, said polishing assistant film is formed in said step (d) to such a thickness that said polishing assistant film has a thickness equal to or larger than 1/N of thickness of said insulating film after said first chemical mechanical polishing process, wherein N is a positive real number.

3. The method of manufacturing a semiconductor device according to claim 1, wherein said polishing assistant film includes a polysilicon film, said insulating film includes a silicon oxide film, and said auxiliary layer includes a stacked layer made of a silicon oxide film and a silicon nitride film, and the formation of said silicon oxide film in said step (c) includes formation by an HDP (High Density Plasma)-CVD method.

4. A method of manufacturing a semiconductor device having a trench isolation structure, comprising the steps of:
   (a) forming an auxiliary layer on a semiconductor substrate;
   (b) forming a plurality of trenches in upper part of said semiconductor substrate including said auxiliary layer;
   (c) forming an insulating film all over the surface to provide a recessed area in which the insulating film is buried in said plurality of trenches and a raised area in which the insulating film projects on said auxiliary layer where said plurality of trenches are absent;

(d) forming a polishing assistant film on said recessed area and said raised area of said insulating film; and (e) performing a chemical mechanical polishing process to said polishing assistant film and said insulating film by using said auxiliary layer as a stopper layer to completely remove said polishing assistant film and said insulating film, wherein, when polishing rate selectivity of said polishing assistant film to said insulating film in said chemical mechanical polishing process is 1/N, said polishing assistant film is formed in said step (d) to a thickness equal to or smaller than 1/N of thickness of said insulating film, and wherein $N \geq 3$.

5. The method of manufacturing a semiconductor device according to claim 4, wherein said polishing assistant film includes a silicon nitride film, said insulating film includes a silicon oxide film, and said auxiliary layer includes a stacked layer made of a silicon oxide film and a silicon nitride film, and the formation of said silicon oxide film in said step (c) includes formation by an HDP-CVD method.

6. A method of manufacturing a semiconductor device, having a trench isolation structure, comprising the steps of:

(a) forming an auxiliary layer on a semiconductor substrate;

(b) forming a plurality of trenches in upper part of said semiconductor substrate including said auxiliary layer;

(c) forming an insulating film all over the surface to provide a recessed area in which the insulating film is buried in said plurality of trenches and a raised area in which the insulating film projects on said auxiliary layer where said plurality of trenches are absent;

(d) forming a polishing assistant film on said recessed area and said raised area of said insulating film; and (e) performing a chemical mechanical polishing process to said polishing assistant film and said insulating film by using said auxiliary layer as a stopper layer to completely remove said polishing assistant film and said insulating film, further comprising the step (f) of, after said step (c) and before said step (d), removing part of said raised area which is predetermined to be difficult to planarize by said chemical mechanical polishing process performed in said step (e).

7. A method of manufacturing a semiconductor device having a trench isolation structure, comprising the steps of:

(a) forming an auxiliary layer on a semiconductor substrate;

(b) forming a plurality of trenches in upper part of said semiconductor substrate including said auxiliary layer;

(c) forming an insulating film all over the surface to provide a recessed area in which the insulating film is buried in said plurality of trenches and a raised area in which the insulating film projects on said auxiliary layer where said plurality of trenches are absent;

(d) forming a polishing assistant film on said recessed area and said raised area of said insulating film; and (e) performing a chemical mechanical polishing process to said polishing assistant film and said insulating film by using said auxiliary layer as a stopper layer to completely remove said polishing assistant film and said insulating film of said raised area.

8. The method of manufacturing a semiconductor device according to claim 7, wherein, when polishing rate selectivity of said polishing assistant film to said insulating film in said chemical mechanical polishing process is 1/N, said polishing assistant film is formed in said step (d) to a thickness equal to or smaller than 1/N of thickness of said insulating film, where N is a positive real number.

9. The method of manufacturing a semiconductor device according to claim 8, wherein $N \geq 3$.

10. The method of manufacturing a semiconductor device according to claim 7, wherein said polishing assistant film includes a silicon nitride film, said insulating film includes a silicon oxide film, and said auxiliary layer includes a stacked layer made of a silicon oxide film and a silicon nitride film, and the formation of said silicon oxide film in said step (c) includes formation by an HDP-CVD method.

11. The method of manufacturing a semiconductor device according to claim 7, further comprising the step (f) of, after said step (c) and before said step (d), removing part of said raised area which is predetermined to be difficult to planarize by said chemical mechanical polishing process performed in said step (e).

* * * * *